United States Patent
Yata

(10) Patent No.: US 8,759,667 B2
(45) Date of Patent: Jun. 24, 2014

(54) PHOTOELECTRIC CONVERSION DEVICE

(75) Inventor: Shigeo Yata, Ogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 13/616,091

(22) Filed: Sep. 14, 2012

(65) Prior Publication Data

US 2013/0000710 A1    Jan. 3, 2013

Related U.S. Application Data

(63) Continuation of application No. PCT/JP2011/060047, filed on Apr. 25, 2011.

(30) Foreign Application Priority Data

Apr. 28, 2010 (JP) .................... 2010-103482

(51) Int. Cl.
*H01L 31/00* (2006.01)
(52) U.S. Cl.
USPC ........................................ 136/255
(58) Field of Classification Search
USPC ................................ 136/243–265
See application file for complete search history.

(56) References Cited

U.S. PATENT DOCUMENTS

| | | | |
|---|---|---|---|
| 6,482,668 B2 | 11/2002 | Okada et al. | |
| 2002/0011263 A1* | 1/2002 | Muramoto et al. | 136/255 |
| 2006/0249197 A1* | 11/2006 | Shima et al. | 136/246 |
| 2010/0206373 A1 | 8/2010 | Goya et al. | |
| 2011/0168259 A1 | 7/2011 | Murata et al. | |

FOREIGN PATENT DOCUMENTS

| | | |
|---|---|---|
| JP | 11-251612 A | 9/1999 |
| JP | 2007-266094 A | 10/2007 |
| WO | WO 2009/119124 A1 | 10/2009 |
| WO | WO 2011/007593 A1 | 1/2011 |

OTHER PUBLICATIONS

International Search Report for PCT Application No. PCT/JP2011/060047 dated May 24, 2011, pp. 1-4.

* cited by examiner

*Primary Examiner* — Jeffrey T Barton
*Assistant Examiner* — Niki Baktiari
(74) *Attorney, Agent, or Firm* — Dittavong Mori & Steiner, P.C.

(57) ABSTRACT

Disclosed is a photoelectric conversion device with improved photoelectric conversion efficiency. In the disclosed photoelectric conversion device, an amorphous silicon photoelectric conversion unit with an amorphous i-type layer and a microcrystalline silicon photoelectric conversion unit with a microcrystalline i-type layer are laminated, and an intermediate layer, which is disposed between the amorphous silicon photoelectric conversion unit and the microcrystalline silicon photoelectric conversion unit, has a lower refractive index than the layers in contact with the front or back surfaces thereof, wherein the higher the crystalline fraction of the microcrystalline i-type layer in the panel surface, the thicker the film of the intermediate layer.

4 Claims, 1 Drawing Sheet

PHOTOELECTRIC CONVERSION DEVICE

CROSS-REFERENCE TO RELATED APPLICATIONS

The present application is a continuation application of International Application No. PCT/JP2011/060047, filed Apr. 25, 2011, the entire contents of which are incorporated herein by reference and priority to which is hereby claimed. The PCT/JP2011/060047 application claimed the benefit of the date of the earlier filed Japanese Patent Application No. 2010-103482 filed Apr. 28, 2010, the entire contents of which are incorporated herein by reference, and priority to which is hereby claimed.

BACKGROUND

1. Technical Field

The present invention relates to a photoelectric conversion device.

2. Related Art

There have been known solar cells using polycrystalline, microcrystalline, or amorphous silicon. In particular, photoelectric conversion devices of laminated structure in which thin films of microcrystalline or amorphous silicon are laminated have been receiving attention, in view of resource consumption, cost reduction, and an increase in efficiency. In general, the photoelectric conversion devices are formed by sequentially laminating a first electrode, one or more semiconductor thin film photoelectric conversion cells, and a second electrode on a substrate whose surface has an insulation property. Each photoelectric conversion unit is composed of a p-type layer, an i-type layer, and an n-type layer laminated in that order from a light incident side.

As a method for increasing conversion efficiency of such a photoelectric conversion device, laminating two or more photoelectric conversion cells in a light incident direction has been known. On the light incident side of the photoelectric conversion device, a first photoelectric conversion unit including a photoelectric conversion layer with a wider band gap is disposed, and subsequently a second photoelectric conversion unit including a photoelectric conversion layer with a band gap narrower than that of the first photoelectric conversion unit is disposed. In this way, photoelectric conversion of incident light with a wide range of wavelengths can be achieved, to thereby improve the conversion efficiency of the device as a whole. For example, there has been known a structure in which an amorphous silicon photoelectric conversion unit (a-Si photoelectric conversion unit) is formed as a top cell, and a microcrystalline photoelectric conversion unit (μc-Si photoelectric conversion unit) is formed as a bottom cell.

Further, the photoelectric conversion device is often employed as integrated modules obtained by dividing the a-Si photoelectric conversion unit and the μc-Si photoelectric conversion unit into a plurality of rectangular cells by means of a laser and connecting the plurality of divided cells in series-parallel combination.

Meanwhile, in a state where a current generated in the μc-Si photoelectric conversion unit governs a current of each cell, currents are limited by a current that passes through a cell that is located in a region where a crystalline fraction of the μc-Si photoelectric conversion unit is lower in a plurality of series-connected cells. For this reason, there has been a problem in that it is impossible to enhance overall power production efficiency in the integrated modules of the photoelectric conversion device.

SUMMARY

In an aspect of the present invention, there is provided a photoelectric conversion device of a tandem type in which an amorphous photoelectric conversion unit including an amorphous i-type layer and a microcrystalline photoelectric conversion unit including a microcrystalline i-type layer are connected on a substrate. The photoelectric conversion device comprises an intermediate layer disposed between the amorphous photoelectric conversion unit and the microcrystalline photoelectric conversion unit and having a refractive index lower than that of layers in contact with the front or back surfaces of the intermediate layer. In the photoelectric conversion device, the intermediate layer having a smaller film thickness is formed in a plane of the substrate where a crystalline fraction of the microcrystalline i-type layer is lower.

According to the present invention, photoelectric conversion efficiency in the photoelectric conversion device can be improved.

DETAILED DESCRIPTION

Figure 1:
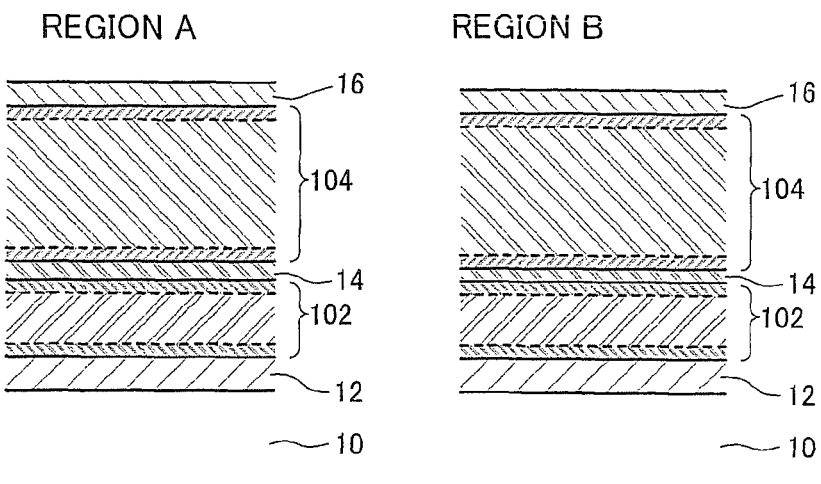
FIG. 1 is a diagram showing a structure of a photoelectric conversion device according to an embodiment of this invention.

FIG. 1 is a cross sectional view showing a structure of a photoelectric conversion device 100 according to an embodiment of this invention. The photoelectric conversion device 100 in this embodiment has a laminated structure formed on a transparent insulating substrate 10, which is defined as a light incident side. The laminated structure is composed of, from the light incident side, a transparent conductive layer 12, an amorphous silicon (a-Si) (photoelectric conversion) unit 102 functioning as a top cell with a wider band gap, an intermediate layer 14, a microcrystalline silicon (μc-Si) (photoelectric conversion) unit 104 functioning as a bottom cell with a band gap narrower than that of the a-Si unit 102, and a back electrode layer 16, in that order. It should be noted that FIG. 1 shows both a region A, which is a high crystallization region of an i-type layer in the μc-Si unit 104 and will be described below, and a region B which is a low crystallization region of the i-type layer.

A substrate composed of a material that is transparent at least in a wavelength range of visible light, such as a glass substrate or a plastic substrate, for example, may be used as the transparent insulating substrate 10. The transparent conductive layer 12 is formed on the transparent insulating substrate 10. For the transparent conductive layer 12, there is preferably used at least one or a combination of a plurality of transparent conductive oxides (TCO), such as a tin oxide ($SnO_2$), a zinc oxide (ZnO), and an indium tin oxide (ITO), doped with tin (Sn), antimony (Sb), fluorine (F), aluminum (Al), or the like. Among them, the zinc oxide (ZnO) is particularly preferable due to its high transmittancy, low resistivity, and excellent plasma-resistant property. The transparent conductive layer 12 can be formed by means of, for example, a sputtering method, a CVD method, or the like. It is preferable for the transparent conductive layer 12 that a film thickness thereof is in a range of from 0.5 μm to 5 μm. Further, it is also preferable that the transparent conductive layer 12 is provided on the surface thereof with projections and depressions that have a light-trapping effect.

On the transparent conductive layer 12, the a-Si unit 102 is formed by sequentially laminating silicon-based thin films of a p-type layer, an i-type layer, and an n-type layer. The a-Si unit 102 can be formed with a plasma CVD method for forming a film by means of a plasma generated from a gas mixture in which a silicon-containing gas, such as silane ($SiH_4$), disilane ($Si_2H_6$), or dichlorosilane ($SiH_2Cl_2$); a carbon-containing gas such as methane ($CH_4$); a p-type dopant containing gas such as diborane ($B_2H_6$); an n-type dopant containing gas such as phosphine ($PH_3$); and a diluent gas such as hydrogen ($H_2$) are mixed. For example, RF plasma CVD at 13.56 MHz is preferably employed as the plasma CVD method.

The p-type layer is formed on the transparent conductive layer 12. The p-type layer is embodied as a p-type amorphous silicon layer (p-type a-Si:H) or a p-type amorphous silicon carbide layer (p-type a-SiC:H), which is no less than 10 nm and no more than 100 nm in film thickness and is doped with a p-type dopant (such as boron). The film quality of the p-type layer can be changed by adjusting a mixture ratio of the silicon-containing gas, the carbon-containing gas, the p-type dopant containing gas, and the diluent gas, the pressure, and high frequency power for generating the plasma.

The i-type layer is implemented as an undoped amorphous silicon film, which is no less than 50 nm and no more than 500 nm in film thickness and formed on the p-type layer. The i-type layer functions as a power production layer in the a-Si unit 102. The film quality of the i-type layer can be changed by adjusting a mixture ratio of the silicon-containing gas and the diluent gas, the pressure, and the high frequency power for generating the plasma.

The n-type layer is implemented as an n-type amorphous silicon layer (n-type a-Si:H) or an n-type microcrystalline silicon layer (n-type μc-Si:H), which is no less than 10 nm and no more than 100 nm in film thickness, formed on the i-type layer, and doped with an n-type dopant (such as phosphor). The film quality of the n-type layer can be changed by adjusting a mixture ratio of the silicon-containing gas, the carbon-containing gas, the n-type dopant containing gas, and the diluent gas, the pressure, and the high frequency power for generating the plasma.

On the a-Si unit 102, the intermediate layer 14 is formed. The intermediate layer 14 has a refractive index lower than those of layers formed on both surfaces of the intermediate layer 14. In this embodiment, the refractive index of the intermediate layer 14 is defined to be lower than both refractive indices of the n-type layer in the a-Si unit 102 and the p-type layer in the μc-Si unit 104. In this way, light that has arrived at the intermediate layer 14 after passing through the transparent insulating substrate 10, the transparent conductive layer 12, and the a-Si unit 102 can be partially reflected toward an a-Si unit 102 side, to thereby increase production of electricity in the a-Si unit 102, while the film thickness of the i-type layer functioning as the power production layer in the μc-Si unit 104 can be reduced.

For the intermediate layer 14, a transparent conductive oxide (TCO) such as the zinc oxide (ZnO) or a silicon oxide (SiOx) may preferably be used. In particular, use of the zinc oxide (ZnO) doped with magnesium (Mg) or the silicon oxide (SiOx) is especially preferable. The transparent conductive oxide (TCO) can be formed, for example, by means of the sputtering method, the CVD method, or the like. In addition, a silicon oxide film (SiOx) is also preferably employed. The silicon oxide film (SiOx) can be formed through the plasma CVD method for forming a film by means of a laser generated from a gas mixture in which the silicon-containing gas such as silane ($SiH_4$), disilane ($Si_2H_6$), or dichlorosilane ($SiH_2Cl_2$); an oxygen-containing gas such as carbon dioxide ($CO_2$); and a diluent gas such as hydrogen ($H_2$) are mixed. The film thickness of the intermediate layer 14 is preferably defined to be in a range of from 50 nm to 100 nm.

In this embodiment, the intermediate layer 14 has a film thickness that is varied in a panel plane of the photoelectric conversion device 100. More specifically, relative to the film thickness of the intermediate layer 14 in a region having a lower crystalline fraction of the i-type layer, which is the power production layer of the below-described μc-Si unit 104, the film thickness of the intermediate layer 14 is increased in a region having a higher crystalline fraction.

Figure 2:
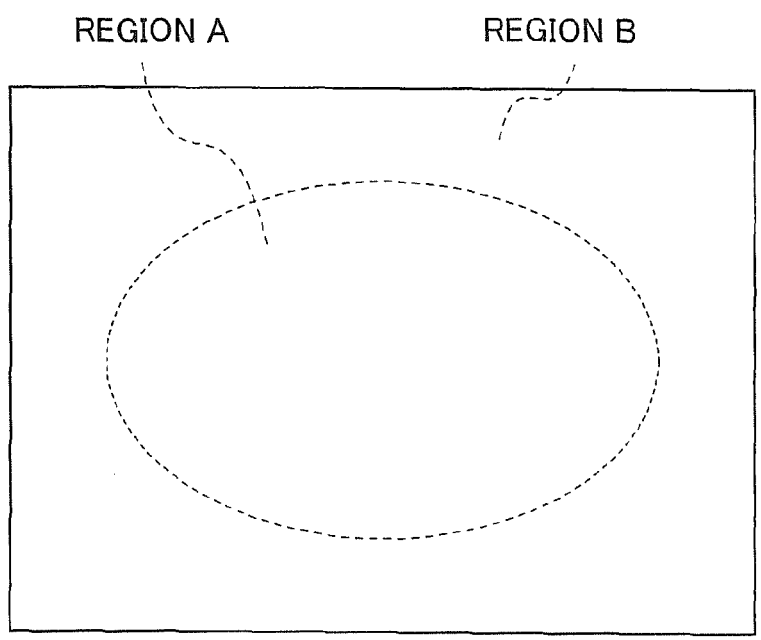
FIG. 2 is a diagram for explaining the distribution of crystallization properties of an i-type layer in a μc-Si unit and the distribution of film thicknesses of an intermediate layer in the embodiment of this invention.

As shown in FIG. 2, for example, the crystalline fraction of the i-type layer, which is the power production layer in the μc-Si unit 104, is typically higher in a region A around the center of the panel plane. Then, the crystalline fraction becomes lower as the i-type layer gets closer to a peripheral region B. With this in view, the film thickness of the intermediate layer 14 is reduced in the peripheral region B so as to be smaller than that of the intermediate layer 14 in the region A around the center as shown in FIG. 1. It should be noted that FIG. 2 schematically shows a distribution in the panel plane, and in practice, both the crystalline fraction of the i-type layer in the μc-Si unit 104 and the film thickness of the intermediate layer 14 are changed continuously.

In order to change the film thickness of the intermediate layer 14, for example, during formation of the intermediate layer 14 with the plasma CVD method, a density of a material gas may be increased in a region where the film is thickened, while the density of the material gas may be decreased in a region where the film is thinned. More specifically, in the plasma CVD method using parallel plate electrodes, an arrangement for supplying the material gas from a central part of the plate electrodes and exhausting the material gas from a peripheral part of the plate electrodes may be employed, to thereby cause the density of the material gas to become higher at the central part than that at the peripheral part in the panel plane. In this way, the intermediate layer 14 can have a greater film thickness in the region A around the center than in the peripheral region B.

Alternatively, the film thickness of the intermediate layer 14 may be varied by, during formation of the intermediate layer 14 with the plasma CVD method, increasing a supply (a flow rate) of the material gas in the region where the film is thickened while decreasing the supply (the flow rate) of the material gas in the region where the film is thinned. Further, a heating temperature to which the transparent insulating substrate 10 is heated may be raised in the region where the film is thickened while the heating temperature to which the transparent insulating substrate 10 is heated may be lowered in the region where the film is thinned. Still further, a higher density of power may be supplied to generate the plasma in the region where the film thickness is increased, while a lower density of power may be supplied to generate the plasma in the region where the film thickness is decreased. The method for changing the film thickness of the intermediate layer 14 is not limited to those described above, and may be implemented using an appropriate combination of the above-described methods.

The distribution of film thicknesses of the intermediate layer 14 in the panel plane can be measured through observation using a scanning electron microscope (SEM) or cross-section observation using a transmission electron microscope (TEM) in each region. In the measurement, because the observed structure of the intermediate layer 14 will be different from those of the a-Si unit 102 and the µc-Si unit 104, and different observations of the µc-Si unit 104 will be obtained depending on the crystalline fraction of the µc-Si unit 104, a determination can be made as to whether or not a formed film thickness of the intermediate layer 14 is greater in the region having a higher crystalline fraction of the i-type layer, which is the power production layer of the µc-Si unit 104, than in the region having a lower crystalline fraction.

It should be noted that the crystalline fraction of the i-type layer, which is the power production layer of the µc-Si unit 104, is defined as a value obtained as described below. A microcrystalline silicon film is formed as a single film on a flat glass substrate under the same film forming conditions as those used for forming the i-type layer of the µc-Si unit 104, and the Raman spectrum of the single film is measured with Raman spectroscopy. Then, peaks of a Raman scattering intensity Ic at approximately 520 cm$^{-1}$ attributable to crystalline silicon and a Raman scattering intensity Ia at approximately 480 cm$^{-1}$ attributable to amorphous silicon are separated. The intensities (heights) of the peaks are used to derive the value of the crystalline fraction from the below-described equation (1). After the measurement of the crystalline fraction as described above is repeated at a plurality of sites in the panel plane, the distribution of crystalline fraction of the i-type layer in the µc-Si unit 104 can be measured in the panel plane.

$$\text{Crystalline fraction}(\%) = Ic/(Ic+Ia) \quad (1)$$

On the intermediate layer 14, the p-type layer, the i-type layer, and the n-type layer are sequentially laminated to form the µc-Si unit 104. The µc-Si unit 104 can be formed with the plasma CVD method for performing film formation by means of the plasma generated from the gas mixture in which the silicon-containing gas, such as silane ($SiH_4$), disilane ($Si_2H_6$), dichlorosilane ($SiH_2Cl_2$); the carbon-containing gas such as methane ($CH_4$); the p-type dopant containing gas such as diborane ($B_2H_6$); the n-type dopant containing gas such as phosphine ($PH_3$); and the diluent gas such as hydrogen ($H_2$) are mixed. The plasma CVD method is preferably implemented, for example, by RF plasma CVD with 13.56 MHz as in the case of the a-Si unit 102.

The p-type layer is formed on the intermediate layer 14. The p-type layer is preferably implemented by a microcrystalline silicon layer, an amorphous layer, or a lamination thereof having a film thickness no less than 5 nm and no more than 50 nm. Further, the amorphous layer is preferably implemented by an amorphous silicon layer (a-Si) or an amorphous silicon carbide layer (a-SiC). The film quality of the p-type layer can be changed by adjusting the mixture ratio of the silicon-containing gas, the carbon-containing gas, the p-type dopant containing gas, and the diluent gas, the pressure, and the high frequency power used for generating the plasma.

The i-type layer is formed on the p-type layer. The i-type layer is implemented by the undoped microcrystalline silicon layer, which is no less than 0.5 µm and no more than 5 µm in film thickness and is formed on the p-type layer. The i-type layer functions as a power production layer in the µc-Si unit 104. The film quality of the i-type layer can be changed by adjusting the mixture ratio of the silicon-containing gas and the diluent gas, the pressure, and the high frequency power used for generating the plasma.

The n-type layer is formed on the i-type layer. The n-type layer is implemented as an n-type microcrystalline silicon layer (n-type µc-Si:H), which is no less than 5 nm and no more than 50 nm in film thickness and doped with the n-type dopant (such as phosphor). However, the µc-Si unit 104 is not limited to the above-described form, and may be implemented in any other form so long as the i-type microcrystalline silicon layer (i-type µc-Si:H) is used as the power production layer.

On the µc-Si unit 104, the back electrode layer 16 is formed. The back electrode layer 16 is a laminated structure composed of a reflective metal and the transparent conductive oxide (TCO). For the transparent conductive oxide (TCO), there is used tin oxide ($SnO_2$), zinc oxide (ZnO), indium tin oxide (ITO), or the like, or one of the above oxides doped with impurities. The transparent conductive oxide (TCO) may be, for example, the zinc oxide doped with aluminum as an impurity. Meanwhile, a metal such as silver (Ag) or aluminum (Al) is used as the reflective metal. The transparent conductive oxide (TCO) and the reflective metal can be formed, for example, by means of the sputtering method, the CVD method, or the like. At least one of the transparent conductive oxide (TCO) and the reflective metal is preferably provided with projections and depressions to enhance the light trapping effect.

In addition, the back electrode layer 16 may be covered with a protective film (not illustrated). The protective film may be a laminated structure composed of PET/Al foil/PET, a monolayer structure of a resin, such as a fluorine-based resin (such as ETFE, PVDF, PCTFE), PC, PET, PEN, PVF, acrylic resin, or a structure in which a metal foil is sandwiched. The protective film may be applied on the back electrode layer 16 by means of a resin filler of EVA, ethylene based resin (such as EEA), PVB, silicone, urethane, acryl, epoxy resin, etc. so as to cover the back electrode layer 16. In this way, an event such as penetration of moisture into the power production layer of the photoelectric conversion device can be prevented.

In this connection, a YAG laser (with a fundamental wave of 1064 nm and a second harmonic wave of 532 nm) may be used for separating the transparent conductive layer 12, the a-Si unit 102, the intermediate layer 14, the µc-Si unit 104, and the back electrode layer 16 into a plurality of cells, to thereby provide a structure composed of the plurality of cells connected in series-parallel combination.

The photoelectric conversion device 100 in this embodiment can be structured as described above. In the region where the crystalline fraction of the i-type layer in the photoelectric conversion device 100 is low, the power production efficiency in the µc-Si unit 104 is low. For this reason, in a case where the µc-Si unit 104 governs a current value of the photoelectric conversion device 100, the current value of the photoelectric conversion device 100 will be limited by the region where the crystalline fraction of the i-type layer in the µc-Si unit 104 is low. According to this embodiment, in the region where the crystalline fraction of the i-type layer in the µc-Si unit 104 is lower, the intermediate layer 14 having a smaller film thickness is formed. In this way, the intermediate layer 14 is caused to reflect a smaller amount of light toward the a-Si unit 102, thereby allowing an increased amount of light to be directed toward the µc-Si unit 104, which, in turn, allows the µc-Si unit 104 to produce a greater amount of electricity (currents). As a result, a current value obtained from the region having the lower crystalline fraction of the i-type layer and having an effect of limiting the current value in the µc-Si unit 104 can be increased, to thereby raise the overall current value of the photoelectric conversion device 100 accordingly. In other words, a more uniform distribution of production of electricity (currents) in the µc-Si unit 104 can be achieved in a substrate plane as compared to the distribution achieved in a conventional way. On the other hand, the intermediate layer 14 of a greater film thickness is formed in the region where the crystalline fraction of the i-type layer in the μc-Si unit 104 is higher. In this way, the amount of light (in particular, light with a wavelength of 500 nm or greater) reflected from the intermediate layer 14 to the a-Si unit 102 can be increased, and a greater amount of light can be accordingly directed to the a-Si unit 102, thereby enhancing the production of electricity (currents) in the a-Si unit 102. Thus, because the production of electricity (currents) can be enhanced without thickening the a-Si unit 102, it is possible to reduce light deterioration, which becomes pronounced when the film is otherwise thickened. As a result, the overall power producing efficiency of the integrated modules in the photoelectric conversion device 100 can be increased.

DESIGNATION OF NUMERALS 10 transparent insulating substrate
12 transparent conductive layer
14 intermediate layer
16 back electrode layer
100 photoelectric conversion device
102 amorphous silicon photoelectric conversion unit (a-Si photoelectric conversion unit)
104 microcrystalline silicon photoelectric conversion unit (μc-Si photoelectric conversion unit)

What is claimed is:

1. A photoelectric conversion device of a tandem type wherein an amorphous photoelectric conversion unit including an amorphous i-type layer and a microcrystalline photoelectric conversion unit including a microcrystalline i-type layer are connected on a substrate, the photoelectric conversion device comprising:
    an intermediate layer disposed between the amorphous photoelectric conversion unit and the microcrystalline photoelectric conversion unit, and having a refractive index lower than that of layers in contact with front and back surfaces of the intermediate layer, wherein
    the intermediate layer includes portions with different thicknesses, and the intermediate layer is formed to have a smaller film thickness in a portion where a crystalline fraction of the microcrystalline i-type layer overlapping in the same region in the plane of the substrate is lower.

2. The photoelectric conversion device according to claim 1, wherein the intermediate layer has a film thickness that is reduced in a peripheral region of the substrate so as to be smaller than a film thickness in a region around a center of the substrate.

3. The photoelectric conversion device according to claim 1, wherein the intermediate layer is formed to have a continuous smaller film thickness.

4. A photoelectric conversion device of a tandem type wherein an amorphous photoelectric conversion unit including an amorphous i-type layer and a microcrystalline photoelectric conversion unit including a microcrystalline i-type layer are connected on a substrate, the photoelectric conversion device comprising:
    an intermediate layer disposed between the amorphous photoelectric conversion unit and the microcrystalline photoelectric conversion unit, and having a refractive index lower than that of layers in contact with front and back surfaces of the intermediate layer, wherein
    in accordance with a crystalline fraction of the microcrystalline i-type layer, the intermediate layer has a smaller thickness where the crystalline fraction is lower, while the intermediate layer has a larger thickness where the crystalline fraction is higher.

* * * * *